United States Patent [19]

Braun et al.

[11] Patent Number: 5,118,027
[45] Date of Patent: Jun. 2, 1992

[54] METHOD OF ALIGNING AND MOUNTING SOLDER BALLS TO A SUBSTRATE

[75] Inventors: Carol Braun, Clifton; George C. Correia, Warrenton; Sheila Konecke-Lease, Leesburg; Richard W. Cummings, Dumfries, all of Va.

[73] Assignee: International Business Machines Corporation, Armonk, N.Y.

[21] Appl. No.: 690,731

[22] Filed: Apr. 24, 1991

[51] Int. Cl.⁵ ............................................ H01L 21/60
[52] U.S. Cl. .................... 228/180.2; 228/245; 228/41; 228/248
[58] Field of Search .............. 228/248, 56.3, 245, 228/246, 180.2, 248

[56] References Cited

U.S. PATENT DOCUMENTS

| | | | |
|---|---|---|---|
| 3,871,015 | 3/1975 | Lin et al. | 228/180.2 |
| 4,067,104 | 1/1978 | Tracy | 228/185 |
| 4,565,314 | 1/1986 | Scholz | 228/180.2 |
| 4,722,470 | 2/1988 | Johary et al. | 228/180.2 |
| 4,739,917 | 4/1988 | Baker | 228/123 |
| 4,752,027 | 6/1988 | Gschwend | 228/207 |
| 4,759,491 | 7/1988 | Fisher | 228/180.2 |
| 4,831,724 | 5/1989 | Elliott | 228/180.2 |
| 4,836,435 | 6/1989 | Napp et al. | 228/180.2 |
| 4,871,110 | 10/1989 | Fukasawa et al. | 228/245 |
| 5,022,580 | 6/1991 | Pedder | 228/254 |
| 5,024,372 | 6/1991 | Altman et al. | 228/248 |

FOREIGN PATENT DOCUMENTS

| | | | |
|---|---|---|---|
| 0307591 | 3/1989 | European Pat. Off. | 228/246 |
| 61-242759 | 10/1986 | Japan | 228/245 |
| 1-256141 | 10/1989 | Japan | 228/180.2 |

Primary Examiner—Richard K. Seidel
Assistant Examiner—Jeanne M. Elpel
Attorney, Agent, or Firm—Jeffrey S. LaBaw

[57] ABSTRACT

A process for fabricating a plurality of solder joints from a low melting point solder paste and high melting point solder balls is described. An abbreviated process flow is as follows: First, the solder balls are placed into cavities in an alignment boat, a vacuum is initiated to hold the boat and solder balls in place. Second, an amount of solder paste is applied directly onto the solder balls in the boat. Third, an alignment plate is placed over the alignment boat to provide a means of roughly aligning the solder ball/solder paste combination to the substrate. Fourth, the substrate is placed through the alignment plate on top of the solder balls in the boat. Pressure is applied to wet the solder paste to the conductive pads on the substrate. Finally, the substrate and alignment boat assembly is processed through a furnace for solder paste reflow. No expensive alignment tools are necessary as the substrate can at least partially re-align itself to the array of solder balls during reflow because of the surface tension exerted by the molten solder paste as it wets the entirety of each conductive pad on the substrate.

17 Claims, 3 Drawing Sheets

METHOD OF ALIGNING AND MOUNTING SOLDER BALLS TO A SUBSTRATE

BACKGROUND OF THE INVENTION

This invention relates generally to surface mount technology in the electronic packaging area. More particularly, it relates to an improved method of aligning and mounting solder ball connectors to a surface of a substrate which will be subsequently joined through surface mount processes to another electronic structure.

Surface mount technology has gained acceptance as the preferred means of joining electronic devices together, particularly in high-end computers. As compared to more traditional pin connector methods, where a pin mounted to the backside of a ceramic module is thrust through a hole in the board, twice the number of modules can be placed at the same board area. Other advantages such as smaller component sizes, greater I/O densities, lower electrical resistance, decreased costs, and shorter signal paths have prompted the industry migration to surface mount technology.

A myriad of solder structures have been proposed for the surface mounting of one electronic structure to another. Typical surface mount processes form the solder structures by screening solder paste on conductive, generally metallic pads disposed on a surface of a first electronic structure, or "substrate". A stencil printing operation is used to align the contact mask to the pads. The solder paste areas on the substrate are aligned to and placed on corresponding pads on a second electronic structure, or "board". In some processes, solder paste may alternatively or additionally be screened on the board pads. After placement, the substrate and board go through a reflow operation to melt the solder paste and create a solder bond between the corresponding pads on substrate and board.

Other known surface mount technologies use solder balls rather than a solder paste to provide the solder structures. By using solder balls, a more exact and somewhat greater quantity of solder can be applied than through screening. The solder balls are aligned and are held to the substrate and melted to form the solder joint on the conductive pads. As before, the substrate with the newly joined solder balls is aligned to the board. The solder balls are then reflowed to form a good solder bond between substrate and board.

However, both the solder paste and solder ball surface mount techniques suffer when the density of the pads increase. A certain solder amount must be maintained to assure a reliable solder joint. As the required quantity of solder becomes large relative to the pad spacing, solder bridging between non corresponding conductive pads becomes a problem. The bridging problem is accentuated by the greater solder amount which is molten during the reflow process.

One method proposed in commonly assigned application Ser. No. 555,120, filed Jul. 18, 1990, entitled "Improved Interconnection Structure And Test Method", which is hereby incorporated by reference, uses a low melting point solder paste screened onto the substrate in conjunction with a high melting point solder ball. The use of a combination of a solder ball and solder paste allows a much greater amount of solder to be placed on the conductor pads due to the greater structural integrity of the solder ball during low temperature reflow. Using the solder ball solder paste combination, the solders can be tailored to provide the best electrical, structural and process characteristics. Referring to FIG. 1, the solder paste 15 applied to the conductive pads 16 of the substrate 17 is chosen to melt at a relatively low temperature, while the composition of the solder ball 11 melts at a high temperature, on reflow, only the small amount of the solder paste 15 melts, setting the solder ball 11 in place. Because only a small amount of the solder is reflowed, the threat of bridging is minimized, yet the reliability of having a large solder joint is achieved.

However, the manufacture of a solder joint using both solder paste and solder balls has proven difficult. Solder balls are difficult to align and handle during the reflow process. Different methods using vibration, brushing and vacuum in association with an alignment plate have been proposed for dealing with solder balls alone. The addition of the solder paste further complicates the process. Many problems were encountered maintaining the solder ball centrality with respect to each other and on the substrate, even to the extent that the solder balls were missing entirely. With the misalignment of the solder balls, bridging between adjacent pad sites became a problem. Good physical contact between the solder balls, solder paste and substrate must be assured while simultaneously preserving the alignment between substrate pads and solder joints. Process time mushroomed as the number of process checks increased.

SUMMARY OF THE INVENTION

It is therefore an object of this invention to automate a process for placing a solder structure comprising a solder paste and a solder ball on an electronic substrate.

It is another object of this invention to fabricate a highly reliable solder joint with reduced bridging between conductor pads.

It is yet another object of this invention to reliably align the solder paste solder ball combination to the substrate pads without the use of expensive alignment tools.

These and other objects are accomplished by applying a measured amount of low melting point solder paste onto each of an array of a high melting point solder balls, the solder balls being held by a vacuum in an alignment boat with precisely machined cavities. An abbreviated process flow is as follows: First, the solder balls are placed into cavities in an alignment boat, a vacuum is initiated to hold the boat and solder balls in place. Second, an amount of solder paste is applied, preferably by screening, directly onto the solder balls in the boat. Third, an alignment plate is placed over the boat to provide a means of roughly aligning the solder ball solder paste combination to the substrate. Fourth, the substrate is placed through the alignment plate on top of the solder balls in the boat. A minimum pressure is applied to wet the solder paste to the conductive pads on the substrate. Finally, the substrate alignment boat assembly is processed through a furnace for solder paste reflow.

No expensive alignment tools are necessary as the substrate can align itself more precisely during reflow than the rough alignment provided by the alignment plate. This is due to the natural tendency for each portion of molten solder paste to wet the entirety of its respective conductive pad on the substrate and the solder ball. The surface tension exerted helps to move the substrate into more precise alignment. Any misalignment after reflow is usually accounted for during a second reflow when the substrate is joined to the board.

DETAILED DESCRIPTION OF THE DRAWINGS

Figure 1:
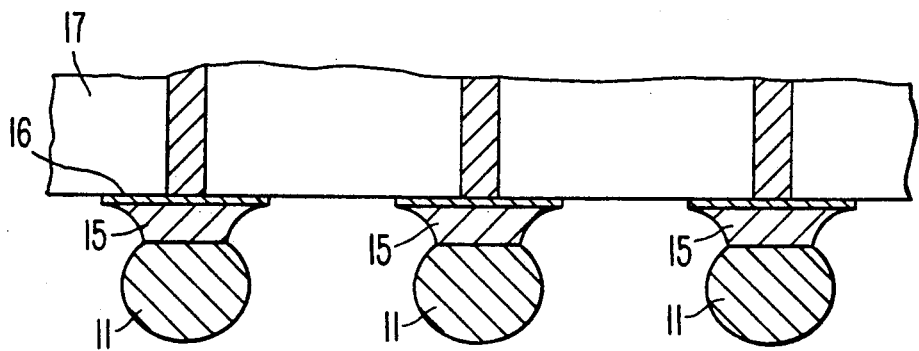
FIG. 1 depicts a solder joint fabricated on a substrate from a low temperature melting point solder paste and a high temperature melting point solder ball.
Figure 2A:
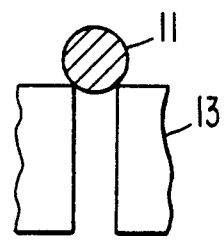
FIGS. 2A-2D depict a preliminary process for joining a high melting point solder ball to a substrate by means of a low melting point solder paste.
Figure 2B:
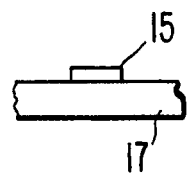
Figure 2C:
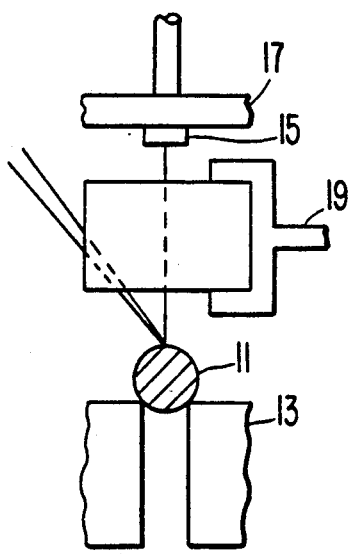
Figure 2D:
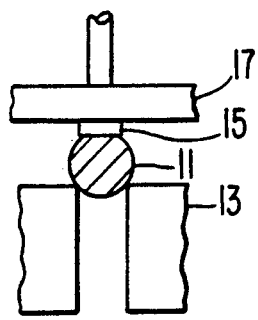

The present invention can be used for connecting solder joints to any parts to be joined in utilizing surface mount technology. In the packaging area, there are a plethora of electronic structures, which require connection to other similar electronic structures or to other levels of packaging. For example, an integrated circuit chip might be mounted to a metallized ceramic substrate; a card on which several integrated chips have been surface mounted, is then subsequently surface mounted to a board which provides interconnection circuitry to a mainframe computer. For the sake of clarity and consistency, the solder ball and solder paste will be said to be mounted to a "substrate".

Occasionally, reference will be made to a "board", the second electronic structure to which the "substrate" is joined. Those skilled in the art, however, would recognize that the present invention could be utilized to mount solder balls to any of a number of electronic structures. The substrate will have a bottom surface having dielectric and metallic portions, the metal portions or pads used to bond the solder joint. In general, the dielectric material will not adhere to the molten solder.

The terms "low melting point" (LMP) and "high melting point" (HMP) are not terms having specific temperatures associated with them. For the process of the present invention, it is only required that the solder paste have a lower melting point than that of the solder ball. An example of a preferred solder paste solder ball combination would be a eutectic solder paste of 37/63 weight per cent Pb/Sn and a non-eutectic solder composition of 90/10 weight per cent Pb/Sn for the solder ball. The term "eutectic" refers to the lowest melting point of an alloy made of two or more constituents such as lead/tin, and is usually given in terms of percentage weight. However, there are a wide range of materials which would be suitable for the present invention, many of which are well known to the solder connection art.

Based on the prior art, an initial attempt at a solder joint process was formulated and is depicted in FIGS. 2A-2D. Solder balls 11 are held on a graphite alignment plate 13 through the use of vacuum. Next, as is common in prior art processes, a eutectic solder paste 15 is screened on the substrate 17 in the pattern of the substrate pads after using an optical alignment tool to align the solder paste mask to the substrate. Next, the substrate 17 is aligned to the solder balls 11. The solder paste pattern 15 on the substrate 17 is aligned to the solder balls 11 in X, Y and the theta directions through the use of a split image optical alignment tool 19. The substrate 17 is then lowered on to the solder balls 11. Finally, the alignment plate 13, solder balls 11, solder paste 15 and substrate are processed through a conveyorized furnace to reflow the eutectic solder paste 15 to connect the balls to the substrate pads.

Unfortunately, it proved difficult and expensive to automate the proposed process. Both the alignment tools, and particularly the split image optical alignment tool are expensive and the alignment procedures are major gating factors in terms of process turnaround. However, as ceramic substrates are not machined to completely uniform dimensions, a vision tool was deemed to be necessary. Alignment systems in the prior art which do not require a vision system rely on the uniformity in size and shape of the parts which they are aligning.

It was also found that it is difficult to maintain control of the solder balls with vacuum alone. Not only was it difficult to assure solder ball centrality with respect to each other and the solder paste and conductive pads on the substrate, the solder balls would occasionally become grossly misaligned or completely dislodged. Poor centrality of the solder balls would contribute to the bridging problem which the solder paste/solder ball combination was intended to eliminate.

Figure 3A:
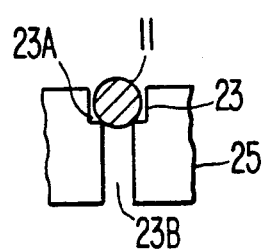
FIGS. 3A-3D depict the process of the present invention for joining a high melting point solder ball to a substrate by means of a low melting point solder paste.

Referring to FIGS. 3A-3D, the process flow of the present invention is described. In FIG. 3A, a HMP solder ball 11 has been positioned in cavity 23 of the alignment boat 25. In the preferred embodiment, the solder balls measure 0.035 inches in diameter and are spaced 0.050 inches from each other. However, those skilled in the art would recognize that the invention could be applied to a wide range of solder ball diameters and spacings. An alignment cavity 23 is machined to correspond to the position of each pad on the substrate. For example, a 25×25 mm ceramic substrate might have a 19 by 19 array of solder pads, therefore, 361 alignment cavities would be present. The cavity 23 has two portions, an alignment cavity 23A which holds the solder ball which is only slightly larger in diameter than the solder ball, and a vacuum through hole 23B which is somewhat narrower than the solder ball. Present manufacturing tolerances indicate that solder ball sizes range from 0.034-0.036 inches, therefore, the ball alignment cavity on the alignment boat should be in the range 0.037-0.038 inches. The depth of the cavity should be slightly less than the diameter of the solder balls. The diameter of the vacuum through hole is not important so long as a sufficient vacuum force can be maintained on the solder ball 11 to hold in place. The alignment cavity and vacuum through hole should be designed so that only a small portion of the solder balls, on the order of 0.003 of an inch, protrudes beyond the top surface of the alignment.

Graphite is a preferred material to fabricate the alignment boat 25. It has a good coefficient of thermal conductivity and its coefficient of expansion is compatible with the ceramic substrate. The high thermal conductivity of graphite speeds the reflow process by conducting the furnace heat to the solder joint. It also helps maintain a consistent reflow temperature across the substrate which is important to maintain joint composition uniformity. Some ceramic materials would be compatible for the alignment boat, however, they are very expensive to manufacture. Also, ceramic materials tend to be fragile while the graphite material is substantially stronger and resists breakage.

After the ball is seated, a vacuum is initiated at the base of alignment boat 25 to hold the solder balls 11 and alignment boat 25 in place. The solder balls are preferably positioned in place by a rubber squeegee. The squeegee (not shown) is brought across and contact with the upper surface of the alignment boat or an alignment plate (not shown) placed on top of the boat and sweeps the excess solder balls away.

Figure 3B:
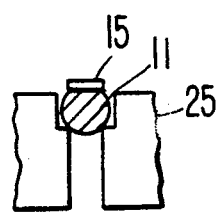

Referring to FIG. 3B, a precisely measured portion of LMP solder paste 15 has been screened on to the solder ball 11. This step is unlike prior art processes where solder paste is applied to the relatively large and stable substrate. Given the difficulty in handling the solder balls themselves, it was somewhat surprising that screening solder paste on the solder balls worked at all, much less was preferred. The solder paste screen (not shown) is usually a metallic contact mask with punched, drilled, or etched holes and is composed of stainless steel, brass or copper. Stainless steel is best for wear. The diameter of the solder paste portion for a 0.035 inch diameter solder ball is approximately 0.03 inches with a height of 0.01 inches. It has been shown that a narrow diameter but relatively high solder paste pad 15 is optimum. The smaller hole allows for better alignment with the substrate and the high volume allows consistency from substrate to substrate. It has been observed that a greater percentage of the total volume of solder paste in the screen is transferred to the solder ball if the solder pad height is high. The added height may help somewhat in accommodating for warpage in the substrate. A total solder weight of 0.163 to 0.3 grams is adequate for a 25×25 mm substrate with 361 solder joints.

Figure 3C:
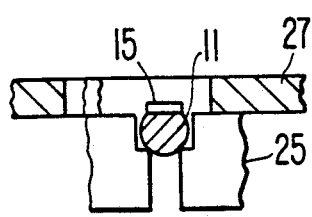

Next, in FIG. 3C, the self-aligning plate 27 has been placed on top of the aligning boat 25 in preparation for the substrate 17. The self-aligning plate 27 is a plate with apertures corresponding to the particular substrate being processed. It roughly aligns the substrate 17 to the solder ball matrix on the alignment boat 25. The requirement of "rough alignment" is met if the solder paste will be in contact with at least part of its corresponding pad on the substrate. It has been found that if less than half of the substrate pad overlies the solder ball, i.e. the edge of the substrate pad is at the solder ball center, reliable joints will be formed by the process of the present invention. The near perfect alignment required to make a good solder joint is not required at this point in the process. The self-aligning plate 27 is preferably made of stainless steel, but can be made of any durable, easily machined material which will not give off contaminants to the process. Those skilled in the art would recognize that other means for roughly aligning the substrate to solder balls would be possible.

Figure 3D:
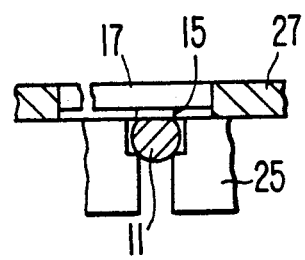

In FIG. 3D, the substrate 17 is placed through the self-aligning plate 27 onto the solder paste pad 15. According to the invention, substrate 17 can be of any number of sizes. For example, a commonly available ceramic substrate on which an integrated chip might be placed would measure 25×25 mm. The substrate 17 is pressed into the solder paste 15 at a force sufficient to ensure good contact. For a 25×25 mm square ceramic substrate with a 361 solder ball in a 19×19 array, a force of about 20-25 pounds would prove sufficient. Sufficient force will bring the substrate in contact with all solder paste pads so that all of the substrate pads are at least wet by the solder paste. As ceramic substrates are frequently warped, the substrate and solder paste may not remain in contact after pressure is released. Nonetheless, superior solder joints are achieved. Different amounts of force will be necessary for substrates of different sizes having a differing number of solder balls.

The self-aligning plate 27 is removed and the substrate 17 solder 11, 15 and alignment boat 25 go through a belt driven furnace. The temperature and dwell time of the furnace is chosen so as to melt the low temperature melting point solder paste 15, but not the high temperature melting point solder ball 11. Using the 37/63 weight percent Pb/Sn solder paste material, one preferred solder reflow process would require approximately 13 minutes in the furnace with a dwell time of 1-4 minutes over 183° C. and a peak temperature no higher than 220° C. When the solder paste 15 is molten, surface tension between the solder paste 15, solder balls 11, and pads on the substrate 17 tends to straighten at least some of the misalignment between balls 11 and substrate 17 which may have occurred during the rough placement of the substrate using the self-alignment plate 27. Thus, no expensive split optical alignment tools are required for the process of the present invention. The substrate 17 is now ready for solder joining operations on to a board or other electronic structure. Any misalignment after reflow is usually accounted for during a second reflow when the substrate is joined to the board.

The method of the present invention has several advantages as compared to the previous attempt to manufacture the solder paste/solder ball joint based on the prior art. Where the solder paste is screened on to the substrate pads, and then the substrate is aligned with the solder balls, two vision systems are needed. One vision system is needed to align the solder paste screen to the substrate; the second vision system is needed to align the substrate to the solder balls held on the alignment boat. This is due to the fact that substrates, unlike the graphite alignment boat, are not precision machined articles and their dimensions vary substantially from substrate to substrate. The second of the alignment systems is the more expensive split optical alignment system. With the present invention no alignment systems are needed. Because of the precision with which the solder balls are held in the precisely machined graphite, no alignment system is needed for the solder paste application as the mask can be aligned physically to the alignment boat or alignment means holding the boat. Further, due to the action of the surface tension of the molten solder paste to help correct misalignment between the substrate and the solder balls and the second reflow at the board level, only a rough alignment of the substrate needs to be practiced. Consequently, no vision system is required for this step.

The method of the present invention is superior in terms of process time. Loading the solder balls in a boat with recesses under vacuum, as opposed to loading the solder balls on a flat alignment boat where vacuum is the only means of holding the solder balls in place is much easier. In the alignment boat of the present method, the solder balls are held much more securely and are not easily displaced. The handling ease and holding power associated with the present alignment boat translate into less operator process time as less time is required to verify that the solder balls are placed and remain in place. The fact no separate optical alignment process is required to determine that the paste screen is aligned to the alignment boat speeds the process of forming the pads of solder paste on the solder balls. In theory, once the alignment boat and solder paste screen are aligned in an initial process check, an unlimited number of substrates can be processed. Similarly, the rough alignment of the substrates to the pasted solder balls speeds the process. It is estimated that the process of the present invention is eight times as fast as the old method where the solder paste is applied to the substrate.

Fewer process defects are encountered using the present invention. The precision machining of the alignment boat allows the ball to ball centrality to be maintained with high accuracy. Because the reflow temperatures are chosen such that the solder balls do not reflow, it is essential that the solder balls be held securely. In the prediminary method where a planar alignment boat was used, 10–50% bridging between the substrate pads routinely occurred. With the process of the present invention, virtually no bridging or missing solder balls occurred so long as the substrate is pressed against the solder paste with the minimum force, and a minimum volume of solder paste is used. The solder joints formed by the present process present an improved appearance both in terms of planarity and centrality. The solder joints are planar within 6½ mils, and the solder balls are aligned to each other within 3 mils.

Because of the improved process time and the lower tooling cost by eliminating the optical alignment tools, the process of the present invention is far less expensive then the initially proposed process. In addition, since there are fewer defects in the manufactured substrates, this further reduces the cost of production. The labor costs also are improved as the process is easier to teach operators and requires fewer process checks as the solder joints are fabricated.

Figure 4:
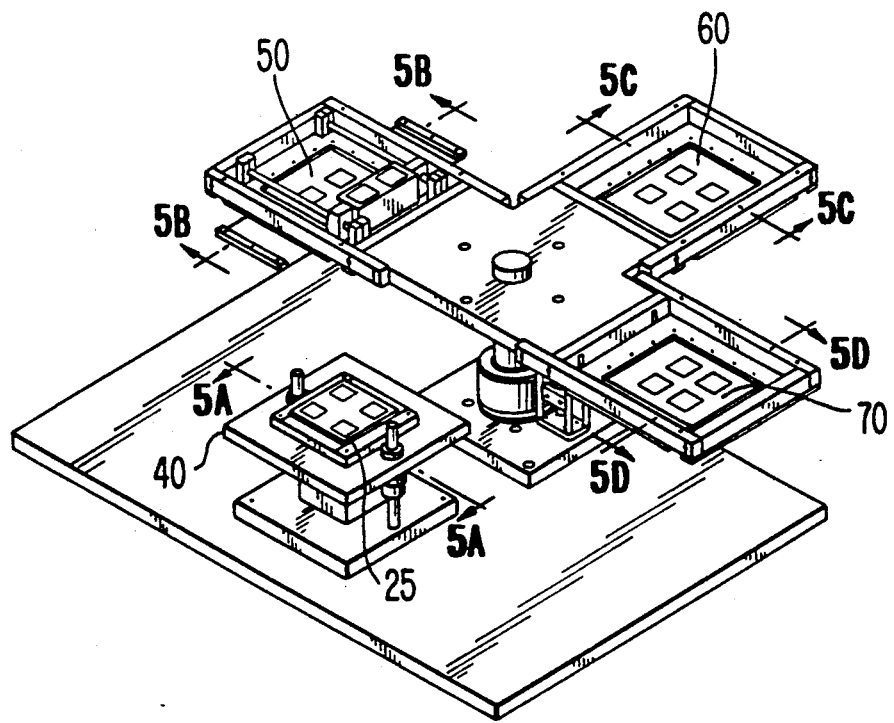
FIG. 4 illustrates a semi automated tool for joining a substrate according to the present invention.

FIG. 4, is an illustration of a semi-automated tool to perform the process according to the present invention. The tool has a boat locator station 40 on which the graphite alignment boat 25 sits. It is preferred that the alignment boat 25 have a sufficient number of solder ball cavities 23 to place four substrates in a given reflow operation. The tool has three separate stages 50, 60 and 70. The first stage is a ball screener stage 50, which is used to screen solder balls into the alignment cavities in the alignment boat 25. The second stage, is the paste screener stage 60 and is used to screen paste onto the solder balls in the alignment boat 25. Finally, the third stage is the alignment locator plate 70 stage. This stage provides the rough alignment for four substrates 17 on to the alignment boat 25. The pressure operation is also performed at this stage. Each of the stations 50, 60, 70 is rotated sequentially to the boat locator station 40 and lowered by means of a hydraulic cylinder to contact the alignment boat 25 for each process step in turn.

Figure 5A:
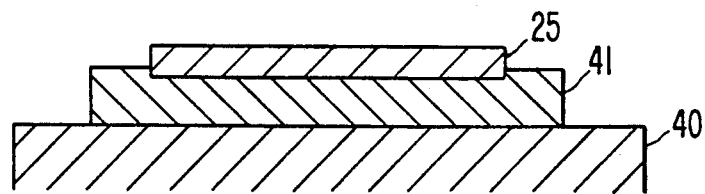
FIGS. 5A-5D show the four sections of the semi automated tool in FIG. 4 in greater detail.

In FIG. 5A, a cross section of the boat locator plate 41 on the top of the boat locator station 40 is shown. The remainder of the station 40 is omitted for sake of clarity. The boat locator plate 41 is preferably made of stainless steel and is precisely machined to locate the alignment boat 25 in X, Y and theta directions. As mentioned previously, the alignment boat 25 is machined to accept four substrates of a particular size and shape. It is preferred that all alignment boats 25 be of a uniform size and shape with the pattern of the alignment cavities being customized for the particular substrate. A vacuum is incorporated at the boat locator station 40 to secure the alignment boat 25 and solder balls.

Figure 5B:
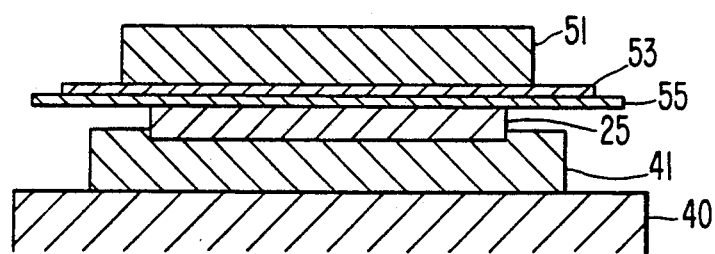

FIG. 5B depicts a cross section of the tool when the ball screener stage 50 is brought in contact with the alignment boat 25. A collection of solder balls is held in the reservoir of the ball reservoir/squeegee 51. As the ball reservoir/squeegee 51 is brought across the face of the ball screen plate 53, a solder ball is dropped into each hole in the ball screen plate 53. A retention plate 55 keeps the solder balls in place. The pattern of the holes in the ball screen plate 53 matches the pattern of the alignment cavities of the alignment boat 25. The thickness of the ball screen plate 53 is close to the diameter of the solder balls so that only a single solder ball is placed in each hole. The close association of the ball reservoir/squeegee 51 with the ball screen plate 53 prevents any solder balls from being left on the plate 53 as the squeegee 51 moves on. The retention plate 55 is removed, depositing the solder balls in the alignment boat 25. Vacuum is maintained to hold the boat 25 and solder balls in place. All parts of the tool are preferably machined from stainless steel.

Figure 5C:
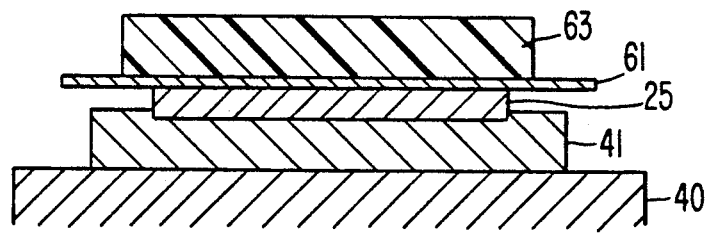

Next, the paste screener stage 60 is moved into position. As shown in FIG. 5C, the paste screen 61 is in contact with the alignment boat 25. The paste screen 61 is similar to those described above except that it has holes corresponding to the pad locations of four substrates. The paste squeegee 63 can be a flat blade of plastic or rubber. Preferably, the edge contacting the paste screen 61 is sharpened to an edge presenting a 45 degree angle to solder screen 61 in each direction. As it is brought across the surface of the screen 61, the squeegee 63 forces the solder paste through the screen 61 on top of the solder balls. After the paste is deposited, the stage 60 is removed from the boat. Vacuum keeps the solder balls and alignment boat 25 in place.

Figure 5D:
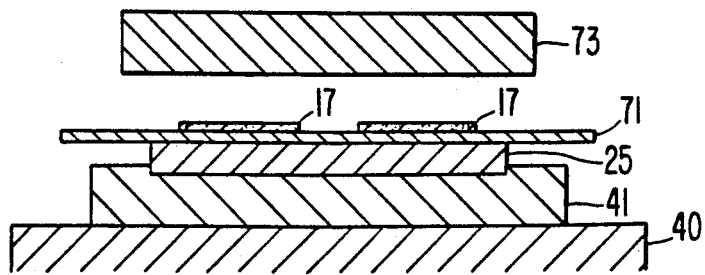

FIG. 5D illustrates the cross section of the alignment locator plate stage 70 as it is brought into contact with the alignment boat 25. The substrate alignment plate 71 has apertures to roughly align four substrates 17 to the solder paste/solder balls array in the alignment boat 25. After the substrates are in place, a module press 73 is brought in contact with the four substrates and a minimum pressure is applied to securely seal the solder paste to the pads of the substrates 17. Preferably, the rectangular press 73 depicted in the FIG. is a mounted cylinder equipped with a strain gauge to measure the pressure applied. The press 73 and stage 70 are removed from the substrates 17 and alignment boat 25 after pressure is applied. The boat/substrate assembly is then processed to the furnace to form the solder joints.

While the invention has been described with reference to preferred embodiment, it will be understood by those skilled in the art that changes may be made without departing from the spirit and scope of the invention.

We claim:

1. A method for fabricating a plurality of solder structures from a plurality of solder paste and solder ball combinations to a plurality of conductive pads on one surface of a substrate comprising the steps of:

securing a plurality of solder balls into a set of aligning cavities in an aligning means, said cavities arranged in a pattern corresponding to a pattern of said conductive pads on said substrate;

applying an amount of solder paste on each of said solder balls to form a plurality of solder paste pads the solder paste having a lower melting temperature than the solder balls;

placing a substrate in rough alignment to said solder paste pads so that at least part of each of said solder paste pads will wet a corresponding conductive pad on said substrate;

pressing said substrate into said solder paste with a minimum force; and, reflowing said solder paste to allow the surface tension generated by said solder paste to help bring said substrate into alignment with said solder balls;

whereby said plurality of solder balls are fixed in place by said aligning means to maintain a desired spacing between the solder balls.

2. The method as recited in claim 1 wherein each of said aligning cavities has a diameter slightly larger than said solder ball and is connected to a vacuum conduit having a diameter smaller than said solder ball at said aligning cavity; and, a vacuum is applied to said vacuum conduit to secure said solder ball.

3. The method as recited in claim 1 wherein said solder paste pads melt at a substantially lower temperature than said solder balls.

4. The method as recited in claim 3 wherein said solder paste is a eutectic composition of 37/63 weight percent Pb/Sn solder and said solder ball is comprised of 90/10 weight percent Pb/Sn solder.

5. The method as recited in claim 4 wherein said solder paste is heated for a period on the order of 13 minutes with a dwell time in the range of 1 to 4 minutes over 183° C. and a peak temperature of no more than 220° C.

6. The method as recited in claim 1 wherein a solder paste screen having a plurality of holes for responding to the position of said solder balls in said alignment cavities is used to apply said solder paste pads.

7. The method as recited in claim 1 wherein said alignment means is a precisely machined graphhite boat having a plurality of aligning cavities machined therein in one surface in a pattern corresponding to a pattern of said conductive pads on said substrate, said alignment cavities having a diameter only slightly larger than the diameter of said solder balls and a depth only slightly smaller than the diameter of said solder balls.

8. The method as recited in claim 1 wherein said aligning cavities on said aligning means are arranged in a pattern corresponding to a plurality of substrates, a plurality of substrates are placed in rough alignment to said solder paste pads, and each of said substrates is pressed into said solder paste.

9. The method as recited in claim 1 wherein said substrate is a metallized ceramic substrate with at least one semiconductor chip bonded on a surface opposite to said solder balls.

10. An apparatus for fabricating a plurality of solder structures from a plurality of solder paste pads and solder ball combinations to a plurality of conductive pads on one surface of a substrate comprising:

a first aligning means for securing and fixing in place said plurality of solder balls in a pattern corresponding to a pattern of said conductive pads on said substrate;

a means for applying a precise amount of solder paste on each of said secured solder balls to form said plurality of solder paste pads, the solder paste having a lower melting temperature than the solder balls;

a second aligning means for placing said substrate in rough alignment to said solder paste so that at least part of each of said solder paste pads on its secured solder ball will wet a corresponding conductive pad on said substrate; and, pressure means to urge said substrate into said solder paste with a minimum force;

whereby when said solder paste pads are reflowed, the surface tension generated by said molten solder paste helps bring said substrate into alignment with said plurality of solder balls.

11. The apparatus as recited in claim 10 wherein said solder paste pads melts at a substantially lower temperature than said solder balls.

12. The apparatus as recited in claim 11, wherein said solder paste is a eutectic composition of 37/63 weight percent Pb/Sn solder and said solder ball is comprised of 90/10 weight percent Pb/Sn solder.

13. The apparatus as recited in claim 12 wherein said solder paste is heated for a period in the order of 13 minutes with a dwell time in the range of 1 to 4 minutes over 183° C. and a peak temperature of no more than 220° C.

14. The apparatus as recited in claim 10 wherein a solder paste screen having a plurality of holes corresponding to the position of said solder balls in said alignment cavities is used to apply said solder paste pads.

15. The apparatus as recited in claim 10 wherein said alignment means is a precisely machine graphite boat having a plurality of aligning cavities machined therein in one surface in a pattern corresponding to a pattern of said conductive pads on said substrate, said alignment cavities having a diameter only slightly larger than the diameter of said solder balls and a depth only slightly smaller than the diameter of said solder balls.

16. The apparatus as recited in claim 10 wherein said aligning cavities on said aligning means are arranged in a pattern corresponding to a plurality of substrates, a plurality of substrates are placed in rough alignment to said solder paste pads, and each of said substrates is pressed into said solder paste.

17. The apparatus as recited in claim 10 where said substrate is a metallized ceramic substrate with at least one semiconductor chip bonded to a surface opposite said solder balls.

* * * * *